United States Patent [19]
Koh et al.

[11] Patent Number: 5,674,773
[45] Date of Patent: Oct. 7, 1997

[54] METHOD FOR PLANARIZING HIGH STEP-HEIGHT INTEGRATED CIRCUIT STRUCTURES

[75] Inventors: Chao-Ming Koh, Hsinchu; Bin Liu, Taipei, both of Taiwan

[73] Assignee: Vanguard International Semiconductor Corporation, Hsin-Chu, Taiwan

[21] Appl. No.: 616,897

[22] Filed: Mar. 15, 1996

[51] Int. Cl.⁶ .................................................. H01L 21/70
[52] U.S. Cl. ................. 437/60; 437/47; 437/52; 437/228; 437/236
[58] Field of Search .................... 437/60, 235, 236, 437/228, 47, 919, 52

[56] References Cited

U.S. PATENT DOCUMENTS

| | | | |
|---|---|---|---|
| 5,077,234 | 12/1991 | Scoopo et al. | 437/228 |
| 5,347,100 | 9/1994 | Fukuda et al. | 437/235 |
| 5,384,288 | 1/1995 | Ying | 437/228 |
| 5,395,785 | 3/1995 | Nguyen et al. | 437/919 |
| 5,488,007 | 1/1996 | Kim et al. | 437/60 |

OTHER PUBLICATIONS

S. Wolf, "Silicon Processing for the VLSI Era vol 2", Lattice Press, Sunset Beach, CA, 1990, pp. 226–228.

*Primary Examiner*—Tuan H. Nguyen
*Attorney, Agent, or Firm*—George O. Saile; Stephen B. Ackerman; Alek P. Szecsy

[57] ABSTRACT

A method for planarizing a high step-height integrated circuit structure within an integrated circuit. There is first formed upon a semiconductor substrate a high step-height integrated circuit structure. Formed then adjoining the high step-height integrated circuit structure is a patterned Global Planarization Dielectric (GPD) layer. There is then formed upon the exposed surfaces of the semiconductor substrate, the high step-height integrated circuit structure and the patterned Global Planarization Dielectric (GPD) layer a reflowable dielectric layer. Finally, the reflowable dielectric layer is reflowed.

19 Claims, 4 Drawing Sheets

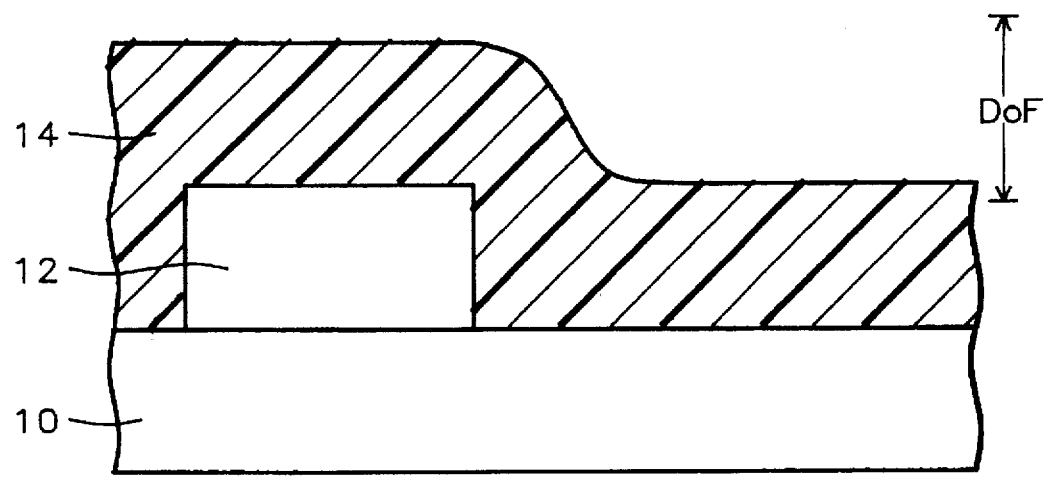
*FIG. 1 - Prior Art*
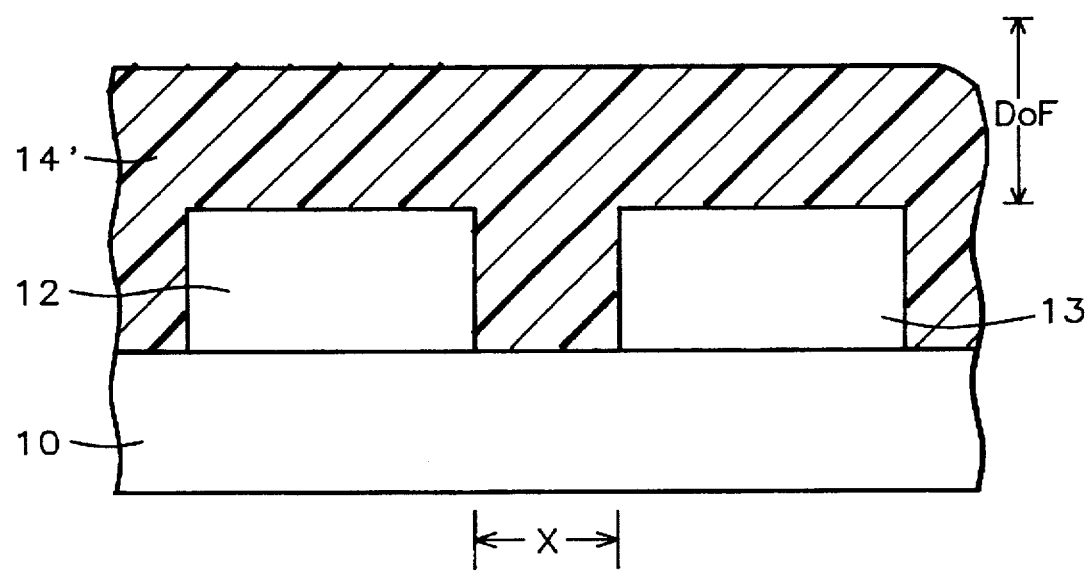
*FIG. 2 - Prior Art*

METHOD FOR PLANARIZING HIGH STEP-HEIGHT INTEGRATED CIRCUIT STRUCTURES

BACKGROUND OF THE INVENTION

1. Field of the Invention

The present invention relates generally to methods for planarizing integrated circuit structures within integrated circuits. More particularly, the present invention relates to methods for planarizing high step-height integrated circuit structures within integrated circuits.

2. Description of the Related Art

As integrated circuit technology has advanced, continuing increases in integrated circuit performance and functionality have derived from corresponding increases in areal packing density of integrated circuit devices within those advanced integrated circuits.

Fortunately, the performance characteristics of several types of integrated circuit devices, including, for example, junction devices such as Field Effect Transistors (FETs) and diodes, may often efficiently be scaled exclusively in areal dimensions while still maintaining or increasing integrated circuit performance and/or functionality. In contrast, however, other types of integrated circuit devices may be scaled exclusively in areal dimensions typically only with significant sacrifice in integrated circuit performance and/or functionality. Common within this latter group of integrated circuit devices are, for example, capacitors of simple geometric design. Capacitors of simple geometric design commonly present significant difficulties in areal scaling due to the areal scaling dependence of capacitance which is typical in capacitors of simple geometric design within integrated circuits.

Due in general to the limitations imposed by areal scaling, and the continuing need for integrated circuits exhibiting higher performance and functionality, it has become common in integrated circuit design and fabrication to compensate for areal scaling in integrated circuit devices which are areal scaling sensitive by increasing, where possible, the vertical dimensions of those areal scaling sensitive integrated circuit devices. This vertical compensation often results in integrated circuits which have significant topographic variations, such as significant topographic step-height variations.

Although increases in vertical dimensions of various integrated circuit devices allow for formation of advanced integrated circuits with desirable levels of increased performance and functionality, such increases are typically not obtained without additional fabrication problems within those advanced integrated circuits. One such problem relates to Depth of Focus (DoF) considerations when photo-exposing blanket photoresist layers formed upon integrated circuit substrates which have formed thereupon integrated circuit devices and structures of high step-height. A pair of schematic cross-sectional diagrams which in general illustrate the Depth of Focus (DoF) problem are shown in FIG. 1 and FIG. 2.

Shown in FIG. 1 is a substrate layer 10 upon whose surface resides a high step-height integrated circuit structure 12. Upon the exposed surfaces of the substrate layer 10 and the high step-height integrated circuit structure 12 is formed a blanket photoresist layer 14. Due to the height and width of the high step-height integrated circuit structure 12, the height of the blanket photoresist layer 14 over the high step-height integrated circuit structure 12 is approximately equal to the height of the blanket photoresist layer 14 over the substrate layer 10. The problem inherent in the topographic variation of the blanket photoresist layer 14 is that the Depth of Focus (DoF) typically achievable with advanced photo-exposure tooling will not encompass the maximum thickness of the blanket photoresist layer 14 at the edge of the high step-height integrated circuit structure 12.

The problem as illustrated by the schematic cross-sectional diagram of FIG. 1 has been disclosed in the art. See, for example, S. Wolf, Silicon Processing for the VLSI Era, Lattice Press (Sunset Beach, Calif.) (1990), vol. 2, pp. 226–28. In partial resolution of the problem, an integrated circuit structure analogous to the integrated circuit structure whose schematic cross-sectional diagram is illustrated within FIG. 2 is often employed.

Illustrated within FIG. 2 is a schematic cross-sectional diagram analogous to the schematic cross-sectional diagram illustrated in FIG. 1. However, within the schematic cross-sectional diagram of FIG. 2 there has been incorporated adjoining the high step-height integrated circuit structure 12 a Planarization Block Mask (PBM) layer 13. When the Planarization Block Mask (PBM) layer 13 adjoins sufficiently closely the high step-height integrated circuit structure 12 the blanket photoresist layer 14' becomes substantially planar over the surfaces of both the high step-height integrated circuit structure 12 and the Planarization Block Mask (PBM) layer 13. The closeness to which the Planarization Block Mask (PBM) layer 13 may be placed to the high step-height integrated circuit structure 12 is determined by the registration tolerance of the photo-exposure tooling employed in forming the Planarization Block Mask (PBM) layer 13.

While incorporating a Planarization Block Mask (PBM) layer 13 typically provides a substantially planar surface to the blanket photoresist layer 14', thus bringing most of the blanket photoresist layer 14' within the Depth of Focus (DoF) of advanced photo-exposure tooling, there still remains a portion of the blanket photoresist layer 14' between the high step height integrated circuit structure 12 and the Planarization Block Mask (PBM) layer 13 (denoted as the distance X in FIG. 2) which remains outside the Depth of Focus (DoF) of advanced photo-exposure tooling. Unexposed and potentially undevelopable photoresist residues in this region may contribute to integrated circuit fabrication, performance or functionality defects.

It is thus in general towards the goal of providing methods for planarizing high step-height integrated circuit structures within advanced integrated circuits that the present invention is directed. More particularly, the present invention is specifically directed towards the goal of planarizing high step-height integrated circuit structures such that all portions of a blanket photoresist layer subsequently formed upon the planarized high step-height integrated circuit structures are within the Depth of Focus (DoF) of advanced photo-exposure tooling.

SUMMARY OF THE INVENTION

A first object of the present invention is to provide a method for planarizing high step-height integrated circuit structures within integrated circuits such that all portions of a blanket photoresist layer subsequently formed upon the planarized high step-height integrated circuit structures are within the Depth of Focus (DoF) of advanced photo-exposure tooling.

A second object of the present invention is to provide a method in accord with the first object of the present invention, which method is also manufacturable.

In accord with the objects of the present invention there is provided a method for planarizing a high step-height integrated circuit structure within an integrated circuit. To practice the method of the present invention, there is first formed upon a semiconductor substrate a high step-height integrated circuit structure. Formed then adjoining the high step-height integrated circuit structure is a patterned Global Planarization Dielectric (GPD) layer. Formed then upon the exposed portions of the semiconductor substrate, the high step-height integrated circuit structure and the patterned Global Planarization Dielectric (GPD) layer is a reflowable dielectric layer. Finally, the reflowable dielectric layer is reflowed.

The present invention provides a method for planarizing high step-height integrated circuit structures within advanced integrated circuits, such that all portions of a blanket photoresist layer subsequently formed upon the planarized high step-height integrated circuit structures may be within the Depth of Focus (DoF) of advanced photo-exposure tooling. By forming adjoining a high step-height integrated circuit structure upon a semiconductor substrate a patterned Global Planarization Dielectric (GPD) layer, at least a portion of the step-height of the high step-height integrated circuit structure is compensated. Upon forming and reflowing a reflowable dielectric layer upon the exposed surfaces of the semiconductor substrate, the high step-height integrated circuit structure and the patterned Global Planarization Dielectric (GPD) layer, an additional portion of the step-height of the high step-height integrated circuit structure is compensated and the gap between the high step-height integrated circuit structure and the patterned Global Planarization Dielectric (GPD) layer is filled with the reflowed reflowable dielectric layer. Thus, through this method, a blanket photoresist layer may be formed upon the surface of the planarized high step-height integrated circuit structure, the blanket photoresist layer being within the Depth of Focus (DoF) of advanced photo-exposure tooling.

The method of the present invention is readily manufacturable. The present invention provides a novel method for planarizing a high step-height integrated circuit structure within an integrated circuit. The method through which the present invention planarizes the high step-height integrated circuit structure is through a novel combination of integrated circuit layer formation, patterning and reflow processes which are otherwise known in the art of integrated circuit manufacture. Since the ordering of processing steps, rather than the nature of the processes or the materials employed within the processes, is novel, the method of the present invention is readily manufacturable.

BRIEF DESCRIPTION OF THE DRAWINGS

The objects, features and advantages of the present invention are understood within the context of the description set forth below. The description is understood in conjunction with the accompanying drawings, which form a material part of this disclosure, wherein:

FIG. 1 and FIG. 2 show a pair of schematic cross-sectional diagrams illustrating Depth of Focus (DoF) limitations when photo-exposing blanket photoresist layers formed upon substrate layers having high step-height integrated circuit structures formed thereupon through a method of the prior art.

DESCRIPTION OF THE PREFERRED EMBODIMENT

The present invention provides a method for planarizing a high step-height integrated circuit structure formed within an integrated circuit upon a semiconductor substrate, such that a blanket photoresist layer formed upon the planarized high step-height integrated circuit structure is fully within the Depth of Focus (DoF) of advanced photo-exposure tooling.

The method of the present invention accomplishes this goal through forming, adjoining the high step-height integrated circuit structure, a patterned Global Planarization Dielectric (GPD) layer which compensates at least in part for the height of the high step-height integrated circuit structure within the integrated circuit. After forming the patterned Global Planarization Dielectric (GPD) layer adjoining the high step-height integrated circuit structure, there is formed and reflowed upon the exposed surfaces of the semiconductor substrate, the high step-height integrated circuit structure and the Global Planarization Dielectric (GPD) layer a blanket reflowable dielectric layer. The blanket reflowable dielectric layer fills the gap between the high step-height integrated circuit structure and the Global Planarization Dielectric (GPD) layer while simultaneously providing upon reflowing a planarized layer upon which may be formed a photoresist layer which is completely within the Depth of Focus (DoF) of advanced photo-exposure tooling.

Although the method of the present invention is most likely to be employed in planarizing high step-height capacitor storage nodes which are typically employed as charge storage locations within Dynamic Random Access Memory (DRAM) and Static Random Access Memory (SRAM) integrated circuits, the method of the present invention may also be employed in planarizing various other types of high step-height integrated circuit structures within various other types of integrated circuits. The method of the present invention may be employed in planarizing high step-height integrated circuit structures within other integrated circuits including but not limited to Application Specific Integrated Circuits (ASICs), integrated circuits having within their fabrications Field Effect Transistors (FETs), integrated circuits having within their fabrications bipolar transistors and integrated circuits having within their fabrications Bipolar Complementary Metal Oxide Semiconductor (BiCMOS) transistors. The method of the present invention has broad applicability in planarizing high step-height integrated circuit structures within various types of integrated circuits.

Figure 3:
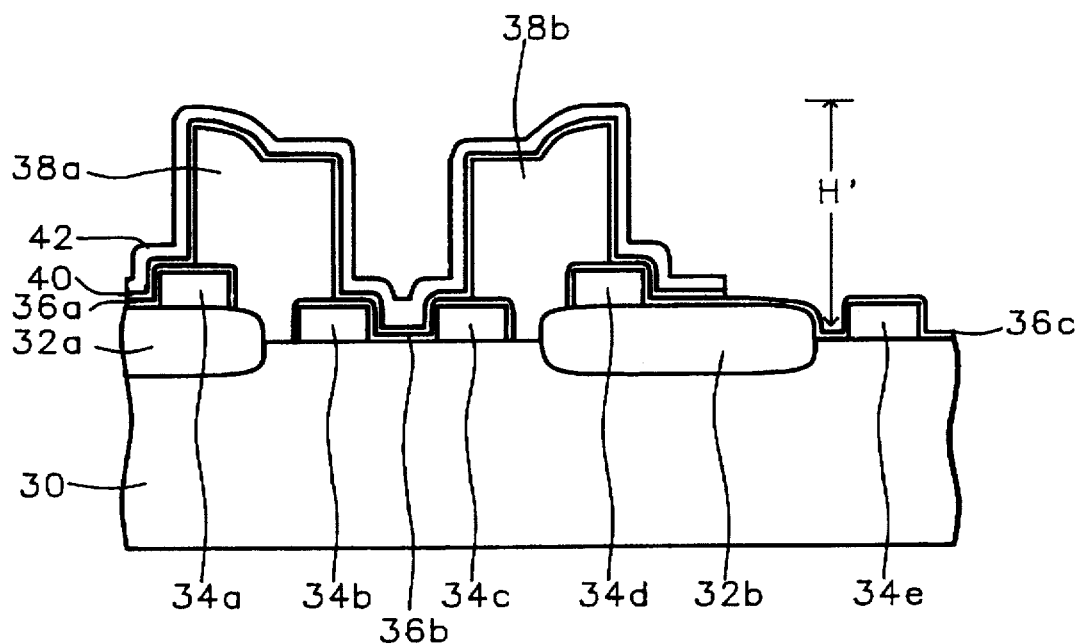
FIG. 3 to FIG. 7 show a series of schematic cross-sectional diagrams illustrating the results of progressive process steps in planarizing an integrated circuit having formed thereupon a pair of high step-height capacitor storage nodes in accord with the preferred embodiment of the method of the present invention.

Referring now to FIG. 3 to FIG. 7, there is shown a series of schematic cross-sectional diagrams illustrating the results of progressive process steps in planarizing an integrated circuit, the integrated circuit having formed therein a pair of high step-height capacitor storage nodes, in accord with the preferred embodiment of the present invention. Shown in FIG. 3 is a schematic cross-sectional diagram of the integrated circuit at its early stages of fabrication.

Shown in FIG. 3 is a semiconductor substrate 30 upon and within whose surface are formed isolation regions 32a and 32b. Semiconductor substrates upon which the present invention may be practiced may be formed with either dopant polarity, any dopant concentration and any crystallographic orientation. Typically, the semiconductor substrate 30 upon which is practiced the present invention is a N- or P- silicon semiconductor substrate having a (100) crystallographic orientation.

Methods by which isolation regions may be formed within and upon semiconductor substrates are known in the art. Such methods include but are not limited to methods whereby a portion of a semiconductor substrate exposed through an appropriate mask is oxidized to form isolation regions within and upon the semiconductor substrate, and methods whereby a separate insulating layer is formed upon a semiconductor substrate and subsequently patterned to form isolation regions upon the semiconductor substrate. For the preferred embodiment of the present invention, the isolation regions 32a and 32b are preferably formed through a thermal oxidation process whereby portions of the semiconductor substrate 30 exposed through an oxidation mask are consumed to form within and upon the semiconductor substrate 30 isolation regions 32a and 32b of silicon oxide. Typically, the thickness of the isolation regions 32a and 32b above the semiconductor substrate 30 is from about 2000 to about 4000 angstroms each.

Also illustrated within FIG. 3 are the interconnects 34a and 34d, the Field Effect Transistor (FET) gate electrodes 34b and 34c, and the contact pad 34e. The interconnects 34a and 34d are employed in forming local short range interconnections within the integrated circuit whose schematic cross-sectional diagram is illustrated in FIG. 3. The Field Effect Transistor (FET) gate electrodes 34b and 34c are employed, along with other components, in forming a pair of Field Effect Transistors (FETs) within and upon the semiconductor substrate 30. Finally, the contact pad 34e is employed in forming connections from semiconductor substrate 30 to semiconductor substrates other than semiconductor substrate 30.

As is understood by a person skilled in the art, the other components employed along with the Field Effect Transistor (FET) gate electrodes 34b and 34c in forming a pair of Field Effect Transistors (FETs) within and upon the semiconductor substrate 30 include: (1) a pair of gate oxide layers each one of which individually reside beneath the Field Effect Transistor (FET) gate electrodes 34b and 34c; and, (2) a series of source/drain electrodes formed into the active region of the semiconductor substrate 30 at locations not occupied by the Field Effect Transistor (FET) gate electrodes 34b and 34c. Typically, the gate oxide layers are formed of silicon oxide at a thickness of about 70 to about 140 angstroms each. Typically, the source/drain electrodes are provided by ion implanting into the semiconductor substrate 30 a dopant of suitable polarity, at an ion implant dose of from about 1E13 to about 5E15 ions per square centimeter and an ion implantation energy of from about 20 to about 80 keV. To provide clarity, the gate oxide layers and the source/drain electrodes have been omitted from the schematic cross-sectional diagram of FIG. 3.

Although the interconnects 34a and 34d, the Field Effect Transistor (FET) gate electrodes 34b and 34c, and the contact pad 34e may be formed from any of several conductive materials, including but not limited to metals, metal alloys, highly doped polysilicon and polycides (polysilicon/metal silicide stacks), the interconnects 34a and 34b, the Field Effect Transistor (FET) gate electrodes 34b and 34c and the contact pad 34e are typically and preferably formed of highly doped polysilicon having a resistivity of no greater than about 100 ohms per square. Preferably, the interconnects 34a and 34d, the Field Effect Transistor (FET) gate electrodes 34b and 34c, and the contact pad 34e are all formed simultaneously through patterning through methods as are conventional in the art of a blanket layer of highly doped polysilicon. The blanket layer of highly doped polysilicon may also be formed through methods as are conventional in the art, including but not limited to Chemical Vapor Deposition (CVD) methods, Low Pressure Chemical Vapor Deposition (LPCVD) methods, Chemical Vapor Deposition (CVD) co-deposition methods and ion implantation methods. Preferably, the blanket layer of highly doped polysilicon, and the corresponding interconnects 34a and 34d, Field Effect Transistor (FET) gate electrodes 34b and 34c, and the contact pad 34e are from about 3000 to about 4000 angstroms thick each.

Also shown in FIG. 3 are the patterned first dielectric layers 36a, 36b and 36c. The patterned first dielectric layer 36a is formed conformally upon the interconnect 34a, the patterned first dielectric layer 36b is formed conformally upon the Field Effect Transistor (PET) gate electrodes 34b and 34c, and the patterned first dielectric layer 36c is formed conformally upon the interconnect 34d and the contact pad 34e. Methods and materials through which patterned dielectric layers may be formed conformally within integrated circuits are known in the art. Patterned dielectric layers are typically, although not exclusively, formed conformally within integrated circuits through patterning through methods as are conventional in the art of corresponding blanket dielectric layers formed conformally within integrated circuits. Blanket dielectric layers may be formed conformally within integrated circuits through methods including but not limited to Chemical Vapor Deposition (CVD) methods, Plasma Enhanced Chemical Vapor Deposition (PECVD) methods and Physical Vapor Deposition (PVD) sputtering methods through which may be formed dielectric layers of dielectric materials including but not limited to silicon oxide dielectric materials, silicon nitride dielectric materials and silicon oxynitride dielectric materials.

For the preferred embodiment of the present invention, the patterned first dielectric layers 36a, 36b and 36c are preferably formed through patterning through methods as are conventional in the art of a blanket first dielectric layer formed conformally of silicon oxide through a Plasma Enhanced Chemical Vapor Deposition (PECVD) method, as is common in the art. Preferably the thickness of the patterned first dielectric layers 36a, 36b and 36c is from about 500 to about 1500 angstroms each.

Also shown in FIG. 3 is a pair of storage capacitors formed from the capacitor storage nodes 38a and 38b, the capacitor dielectric layer 40 and the capacitor plate layer 42. Each of the preceding components which are employed in forming the pair of storage capacitors is conventional to the art. Typically, although not exclusively, each of the preceding components may be formed through photolithographic patterning and etching methods analogous to the photolithographic patterning and etching methods through which are formed the patterned first dielectric layers 36a, 36b and 36c. The materials from which are formed the components of the pair of storage capacitors will, however, typically be different.

For the preferred embodiment of the present invention, the capacitor storage nodes 38a and 38b are preferably, although not exclusively, formed through patterning through methods as are conventional in the art of a blanket highly doped polysilicon layer typically formed upon the semiconductor substrate 30 through a Low Pressure Chemical Vapor Deposition (LPCVD) method employing silane as a silicon source material along with suitable dopant species. Preferably, the blanket highly doped polysilicon layer is doped to yield a resistivity of no greater than about 100 ohms per square. Preferably, the blanket highly doped polysilicon layer, and the capacitor storage nodes 38a and 38b which are formed from the blanket highly doped polysilicon layer, are about 3000 to about 7000 angstroms thick with respect to the surfaces of the patterned first dielectric layers 36a, 36b and 36c.

The capacitor dielectric layer 40 is preferably, although not exclusively, formed through methods and materials analogous to the methods and materials through which is preferably formed the patterned first dielectric layers 36a, 36b and 36c. Preferably the capacitor dielectric layer 40 is from about 50 to about 100 angstroms thick.

Finally, the capacitor plate layer 42 is preferably, although not exclusively, formed through methods and materials analogous to the methods and materials through which are formed the capacitor storage nodes 38a and 38b. Preferably, the capacitor plate layer 42 is formed of highly doped polysilicon having a resistivity no greater than about 200 ohms per square. Preferably, the capacitor plate layer 42 is from about 500 to about 2000 angstroms thick.

Upon forming the capacitor plate layer 42 there is formed an integrated circuit having a pair of high step-height storage capacitors formed therein. The maximum step-height, H', within the integrated circuit is from about 8550 to about 17100 angstroms. The maximum step height, H', consists of the sum of: (1) the thickness of the isolation region 32b above the semiconductor substrate 30 at about 2000 to about 4000 angstroms; (2) the thickness of the interconnect 34d at about 3000 to about 4000 angstroms; (3) the thickness of the capacitor storage node 38b above the patterned first dielectric layer 36c at about 3000 to about 7000 angstroms; (4) the thickness of the capacitor dielectric layer 40 at about 50 to about 100 angstroms; and (5) the thickness of the capacitor plate layer 42 at about 500 to about 2000 angstroms. For comparison purposes, the Depth of Focus (DoF) typically achieved with advanced photo-exposure tooling is from about 8000 to about 10000 angstroms. Thus the method of the present invention provides value in planarizing any high step-height integrated circuit structure of step-height greater than about 8000 to about 10000 angstroms.

Figure 4:
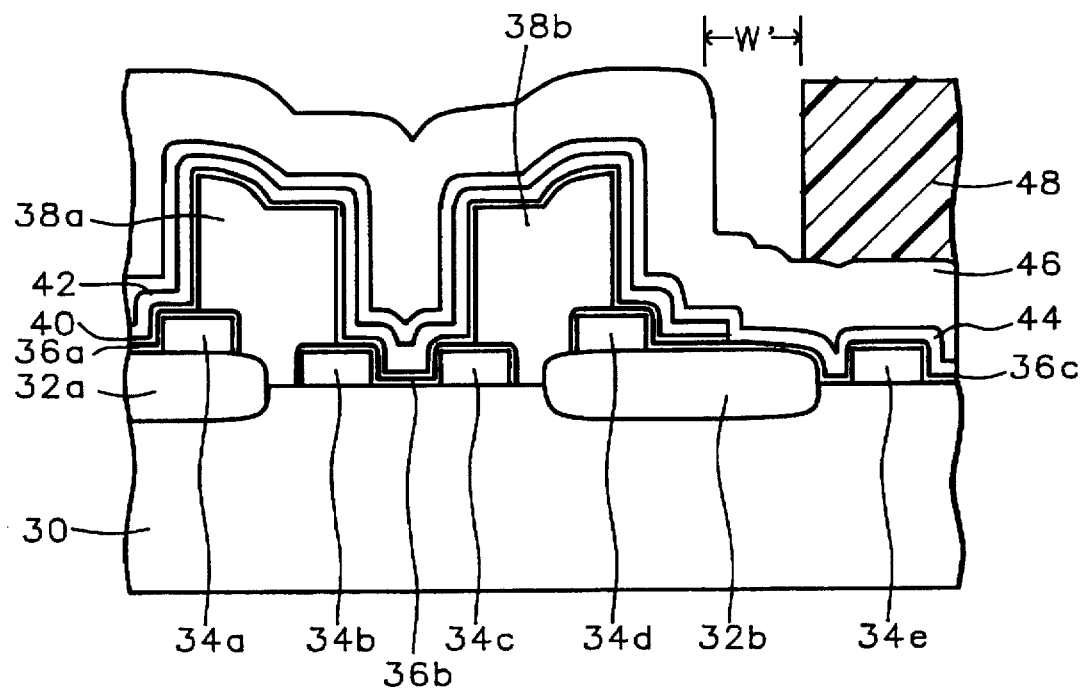

Referring now to FIG. 4, there is shown a schematic cross-sectional diagram illustrating the results of further processing of the integrated circuit whose structure is illustrated in FIG. 3. Shown in FIG. 4 is the presence of a blanket barrier dielectric layer 44 formed upon the surface of the integrated circuit whose structure is illustrated in FIG. 3. Methods and materials through which blanket barrier dielectric layers may in general be formed within integrated circuits are known in the art. Blanket barrier dielectric layers may be formed through methods and materials analogous to the methods and materials through which are formed other dielectric layers within integrated circuits, such as the blanket first dielectric layer from which is formed the patterned first dielectric layers 36a, 36b and 36c within the preferred embodiment of the present invention. Analogously with the blanket first dielectric layer from which is formed the patterned first dielectric layers 36a, 36b and 36c, it is often preferred that blanket barrier dielectric layers be formed of highly dense dielectric materials which provide the most optimal barrier properties. Thus, for the preferred embodiment of the present invention, the blanket barrier dielectric layer 44 is also preferably formed of a silicon oxide deposited upon the surface of the integrated circuit illustrated in FIG. 3 through a Plasma Enhanced Chemical Vapor Deposition (PECVD) method, as is known in the art. Preferably, the thickness of the blanket barrier dielectric layer 44 is from about 500 to about 1500 angstroms.

Formed upon the surface of the blanket barrier dielectric layer 44 is a blanket Global Planarization Dielectric (GPD) layer 46. Analogously with the blanket barrier dielectric layer 44, the blanket Global Planarization Dielectric (GPD) layer 46 may also be formed through methods and materials through which is formed the blanket layer from which in turn is formed is formed the patterned first dielectric layers 36a, 36b and 36c. For the preferred embodiment of the present invention, however, it is preferred that the blanket Global Planarization Dielectric (GPD) layer 46 be formed of a dielectric material exhibiting a substantial etch selectivity with respect to the dielectric material from which is formed the blanket barrier dielectric layer 44. Preferably, the difference in etch selectivity is greater than about 5:1. Under circumstances of etch selectivity difference of greater than about 5:1, the blanket barrier dielectric layer 44 serves as an etch stop when subsequently etching the blanket Global Planarization Dielectric (GPD) layer 46. Thus, although other materials may alternatively be employed, the blanket Global Planarization Dielectric (GPD) layer 46 is preferably formed of a silicon oxide formed through a Chemical Vapor Deposition (CVD) method rather than a silicon oxide formed through a Plasma Enhanced Chemical Vapor Deposition (PECVD) method. Alternatively, the blanket Global Planarization Dielectric (GPD) layer 46 may be also be formed from a Boro-Silicate-Glass (BSG), a Phospho-Silicate-Glass (PSG) or a Boro-Phospho-Silicate-Glass (BPSG). Preferably, the thickness of the blanket Global Planarization Dielectric (GPD) layer 46 is from about 4000 to about 9000 angstroms.

Finally, there is shown in FIG. 4 the presence of a patterned photoresist layer 48 formed upon the surface of the blanket Global Planarization Dielectric (GPD) layer 46 adjoining one of the pair of high step-height storage capacitors. As is common in the art, the patterned photoresist layer 48 is patterned from a blanket photoresist layer. The blanket photoresist layer from which is patterned the patterned photoresist layer 48 may be formed of any photoresist material provided that the photoresist material has limited susceptibility to degradation when exposed to etch processes to which the patterned photoresist layer 48 will subsequently be exposed. Typically, the thickness of the patterned photoresist layer 48 and the blanket photoresist layer from which is formed the patterned photoresist layer 48 is from about 8000 to about 12000 angstroms. Typically, the width, W', of the gap between the patterned photoresist layer 48 and the blanket Global Planarization Dielectric (GPD) layer 46 is from about 5000 to about 10000 angstroms. For comparison purposes, the registration tolerance of advanced photo-exposure tooling is typically from about 1000 to about 1500 angstroms.

Figure 5:
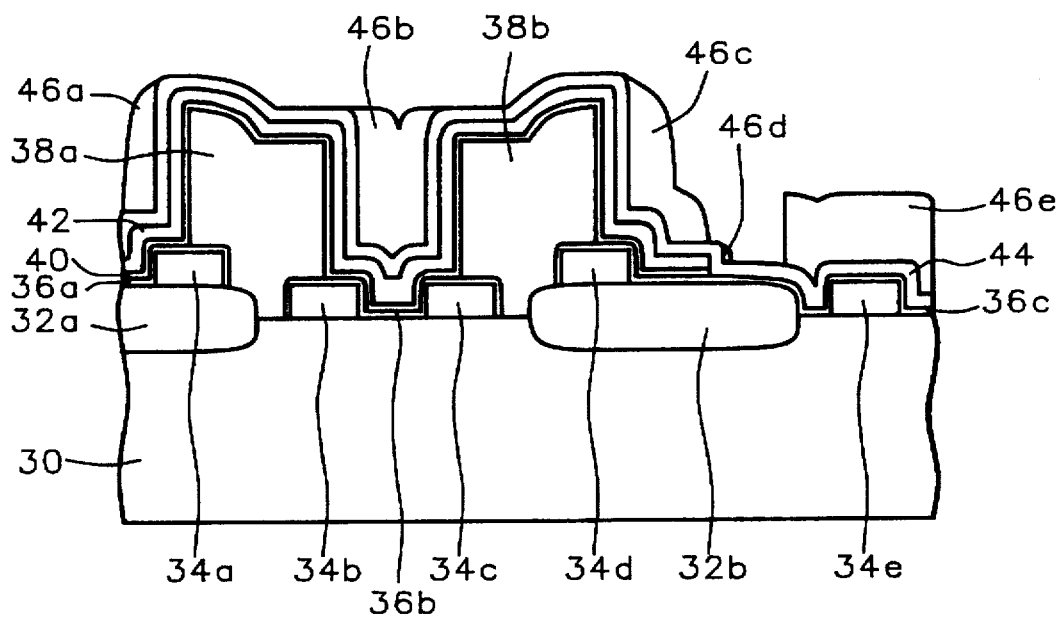

Referring now to FIG. 5, there is shown a schematic cross-sectional diagram illustrating the results of further processing of the integrated circuit whose schematic cross-sectional diagram is illustrated in FIG. 4. Shown in FIG. 5 is the results of etching the blanket Global Planarization Dielectric (GPD) layer 46, employing the patterned photoresist layer 48 as an etch mask, followed by removal of the patterned photoresist layer 48. Although other etch methods may be employed, the blanket Global Planarization Dielectric (GPD) layer 46 is preferably etched through an anisotropic Reactive Ion Etch (RIE) etch employing reactive fluorine species to leave remaining the Global Planarization Dielectric (GPD) spacer layers 46a, 46b, 46c and 46d, and the patterned Global Planarization Dielectric (GPD) layer 46e. The thickness of the patterned Global Planarization Dielectric (GPD) layer 46e compensates for at least some of the step-height of the high step-height storage capacitors.

Figure 6:
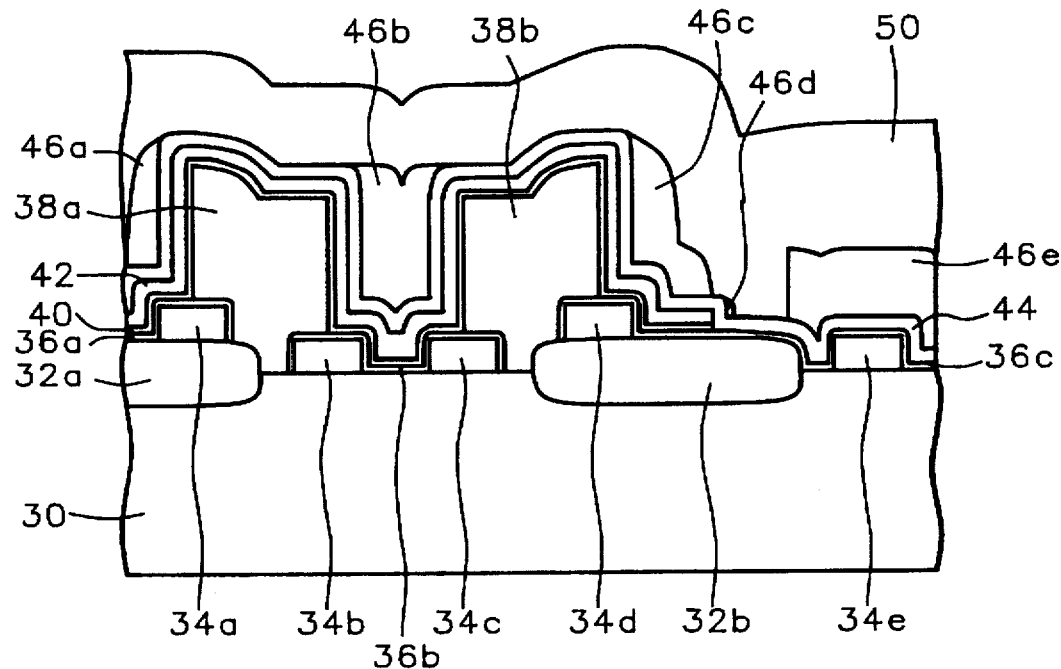

Referring now to FIG. 6 there is shown a schematic cross-sectional diagram illustrating the results of further processing of the integrated circuit whose structure is illustrated in FIG. 5. Shown in FIG. 6 is the presence of a blanket reflowable dielectric layer 50 which is formed upon the surface of the integrated circuit whose structure is illustrated in FIG. 5. Methods and materials through which may be formed within integrated circuits blanket reflowable dielectric layers are known in the art. Blanket reflowable dielectric materials may be formed of materials including but not limited to certain organic polymer dielectric materials and certain oxide dielectric materials. The reflowable dielectric materials which are oxide dielectric materials are typically, although not exclusively, silicate glasses, including but not limited to Boro-Silicate-Glass (BSG), Phospho-Silicate-Glass (PSG) and Boro-Phospho-Silicate-Glass (BPSG).

For the preferred embodiment of the present invention, thee blanket reflowable dielectric layer 50 is preferably formed of a reflowable oxide dielectric material which is a reflowable silicate glass. The reflowable silicate glass may be a Boro-Silicate-Glass (BSG), a Phospho-Silicate-Glass (PSG) or a Boro-Phospho-Silicate-Glass (BPSG). Preferably the reflowable silicate glass has a total dopant (i.e.: boron and/or phosphorus) concentration of about 8 weight percent maximum, with individual boron and phosphorus dopant concentrations in the range of from about 3 weight percent to about 5 weight percent each. Preferably, the blanket reflowable dielectric layer 50 is from about 3000 to about 6000 angstroms thick.

Figure 7:
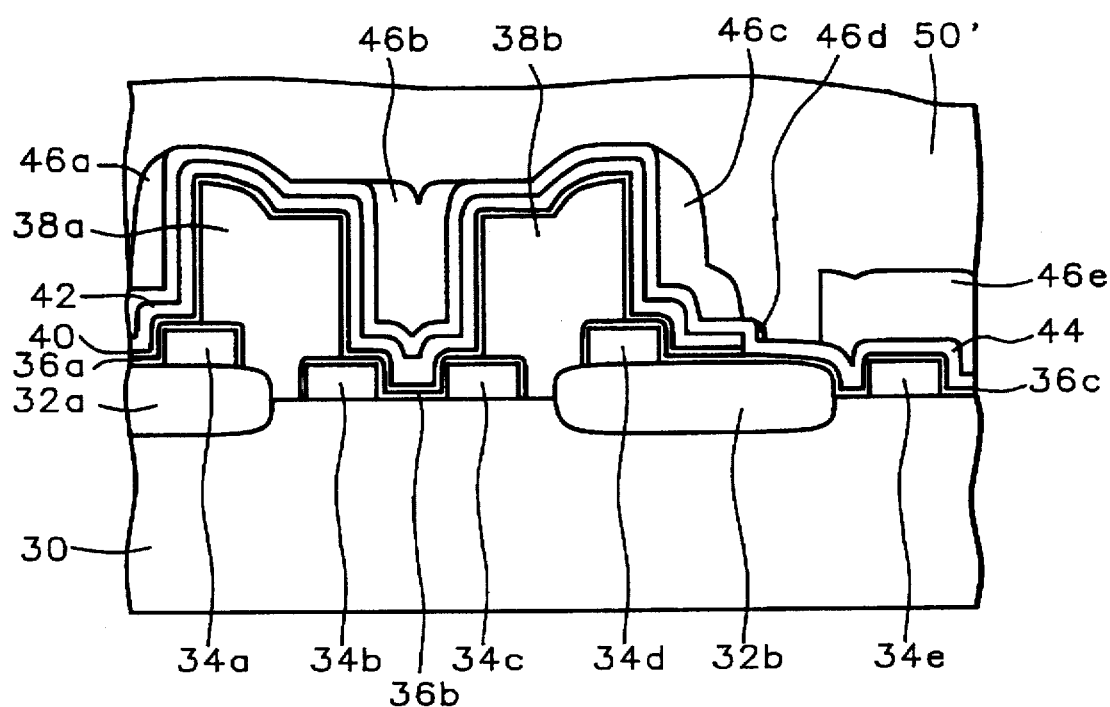

Referring now to FIG. 7, there is shown a schematic cross-sectional diagram illustrating the results of further processing of the integrated circuit whose structure is illustrated in FIG. 6. Shown in FIG. 7 is the presence of the reflowed blanket reflowable dielectric layer 50' which is formed through reflowing the blanket reflowable dielectric layer 50. Methods through which reflowable dielectric layers within integrated circuits may be reflowed are known in the art. Such methods include but are not limited to thermal reflow methods where reflow of the reflowable dielectric layer is effectuated solely through application of heat, and high intensity light assisted reflow methods where the reflowable dielectric layer is subjected to an intense light source at a wavelength which is readily absorbed and dissipated as heat.

For the preferred embodiment of the present invention, the reflowing of the blanket reflowable dielectric layer 50 formed of a reflowable silicate glass material to form the reflowed blanket reflowable dielectric layer 50' is preferably undertaken through a purely thermal process at a temperature of from about 850 to about 900 degrees centigrade for a time period of from about 10 to about 30 seconds.

Upon reflowing the blanket reflowable dielectric layer 50 to form the reflowed blanket reflowable dielectric layer 50' there is formed the integrated circuit of the preferred embodiment of the present invention. The integrated circuit has formed therein a pair of high step-height storage capacitors. The high step-height storage capacitors are planarized such that a photoresist layer may be formed within the integrated circuit upon the planarized high step-height storage capacitors, the photoresist layer remaining completely within the Depth of Focus (DoF) of advanced photoexposure tooling.

As is understood by a person skilled in the art, the preferred embodiment of the method of the present invention is illustrative of the method of the present invention by which high step-height integrated circuit structures within integrated circuits may be planarized, rather than limiting of the method of the present invention by which high step-height integrated circuit structures within integrated circuits may be planarized. Revisions may be made to methods, materials, structures and dimensions through which is practiced the high step-height integrated circuit structure planarizing method Of the present invention while still providing a high step-height integrated circuit structure planarizing method which is within the spirit and scope of the present invention.

What is claimed is:

1. A method for planarizing a high step-height integrated circuit structure within an integrated circuit comprising:
   forming over a semiconductor substrate a high step-height integrated circuit structure;
   forming over the semiconductor substrate and upon the high step-height integrated circuit structure a blanket Global Planarization Dielectric (GPD) layer, the blanket Global Planarization Dielectric (GPD) layer having a first upper portion formed upon the high step height integrated circuit structure and a contiguous second lower portion formed over the semiconductor substrate at a location adjacent to the high step-height integrated circuit structure;
   forming upon the second lower portion of the blanket Global Planarization Dielectric (GPD) layer but not upon the first upper portion of the blanket Global Planarization Dielectric (GPD) layer a patterned photoresist layer;
   etching anisotropically the blanket Global Planarization Dielectric (GPD) layer while employing the patterned photoresist layer as an etch mask layer to form a Global Planarization Dielectric (GPD) spacer layer adjoining the high step-height integrated circuit structure and a patterned Global Planarization Dielectric (GPD) layer adjacent the Global Planarization Dielectric (GPD) spacer layer;
   stripping the patterned photoresist layer from the semiconductor substrate;
   forming upon the exposed surfaces of the high step-height integrated circuit structure, the Global Planarization Dielectric (GPD) spacer layer and the patterned Global Planarization Dielectric (GPD) layer a reflowable dielectric layer; and
   reflowing the reflowable dielectric layer.

2. The method of claim 1 wherein the high step-height integrated circuit structure has a step-height of at least about 8000 to about 10000 angstroms.

3. The method of claim 1 wherein the patterned Global Planarization Dielectric (GPD) layer has a thickness of about 4000 to about 9000 angstroms.

4. The method of claim 1 wherein a horizontal distance along the semiconductor substrate separating the Global Planarization Dielectric (GPD) spacer layer from the patterned Global Planarization Dielectric (GPD) layer is from about 5000 to about 10000 angstroms.

5. The method of claim 1 wherein the thickness of the reflowable dielectric layer is from about 3000 to about 6000 angstroms.

6. The method of claim 1 wherein the reflowable dielectric layer is a reflowable oxide dielectric layer.

7. The method of claim 6 wherein the reflowable oxide dielectric layer is a reflowable silicate glass layer.

8. The method of claim 7 wherein the reflowable silicate glass layer is chosen from the group of reflowable silicate glass layers consisting of reflowable Boro-Silicate-Glass (BSG) layers, reflowable Phospho-Silicate-Glass (PSG) layers and reflowable Boro-Phospho-Silicate-Glass (BPSG) layers.

9. The method of claim 8 wherein the reflowable silicate glass layer is reflowed at a temperature of about 850 to about 900 degrees centigrade for a time period of from about 10 to about 30 minutes.

10. A method for planarizing a high step-height storage capacitor within an integrated circuit comprising:

forming within and upon a semiconductor substrate an integrated circuit, the integrated circuit having formed therein a high step-height storage capacitor;

forming over the semiconductor substrate and upon the high step-height storage capacitor a blanket Global Planarization Dielectric (GPD) layer, the blanket Global Planarization Dielectric (GPD) layer having a first upper portion formed upon the high step-height storage capacitor and a contiguous second lower portion formed over the semiconductor substrate adjacent to the high step-height storage capacitor;

forming upon the second lower portion of the blanket Global Planarization Dielectric (GPD) layer but not upon the first upper portion of the blanket Global Planarization Dielectric (GPD) layer a patterned photoresist layer;

etching anisotropically the blanket Global Planarization Dielectric (GPD) layer while employing the patterned photoresist layer as an etch mask layer to form a Global Planarization Dielectric (GPD) spacer layer adjoining the high step-height integrated circuit structure and a patterned Global Planarization Dielectric (GPD) layer adjacent the Global Planarization Dielectric (GPD) spacer layer;

stripping the patterned photoresist layer from the semiconductor substrate;

forming upon exposed surfaces of the high step-height storage capacitor, the Global Planarization Dielectric (GPD) spacer layer and the patterned Global Planarization Dielectric (GPD) layer a reflowable dielectric layer; and reflowing the reflowable dielectric layer.

11. The method of claim 10 wherein the integrated circuit is chosen from the group of integrated circuits consisting of Dynamic Random Access Memory (DRAM) integrated circuits and Static Random Access Memory (SRAM) integrated circuits.

12. The method of claim 10 wherein the high step-height storage capacitor has a step-height of about 8550 to about 17100 angstroms.

13. The method of claim 10 wherein the patterned Global Planarization Dielectric (GPD) layer has a thickness of about 4000 to about 9000 angstroms.

14. The method of claim 10 wherein a horizontal distance along the semiconductor substrate separating the the Global Planarization Dielectric (GPD) spacer layer from the patterned Global Planarization Dielectric (GPD) layer is from about 5000 to about 10000 angstroms.

15. The method of claim 10 wherein the thickness of the reflowable dielectric layer is from about 3000 to about 6000 angstroms.

16. The method of claim 10 wherein the reflowable dielectric layer is a reflowable oxide dielectric layer.

17. The method of claim 16 wherein the reflowable oxide dielectric layer is a reflowable silicate glass layer.

18. The method of claim 17 wherein the reflowable silicate glass layer is chosen from the group of reflowable silicate glass layers consisting of reflowable Boro-Silicate-Glass (BSG) layers, reflowable Phospho-Silicate-Glass (PSG) layers and reflowable Boro-Phospho-Silicate-Glass (BPSG) layers.

19. The method of claim 18 wherein the reflowable silicate glass layer is reflowed at a temperature of about 850 to about 900 degrees centigrade for a time period of from about 10 to about 30 minutes.

* * * * *